United States Patent [19]
Almulla

[11] Patent Number: 5,280,198
[45] Date of Patent: Jan. 18, 1994

[54] POWER SUPPLY LEVEL DETECTOR

[75] Inventor: Waleed S. Almulla, Folsom, Calif.

[73] Assignee: Intel Corporation, Santa Clara, Calif.

[21] Appl. No.: 973,166

[22] Filed: Nov. 6, 1992

[51] Int. Cl.⁵ .................. H03K 3/01; H03K 5/153
[52] U.S. Cl. .................. 307/296.6; 307/355;
307/272.3; 307/296.8; 307/362; 307/363
[58] Field of Search ........... 307/350, 355, 362-3,
272.3, 296.6, 296.8

[56] References Cited
U.S. PATENT DOCUMENTS 5,191,235 3/1993 Hara .................. 307/362

*Primary Examiner*—Margaret R. Wambach
*Attorney, Agent, or Firm*—Blakely, Sokoloff, Taylor & Zafman

[57] ABSTRACT

A power supply level detector. The power supply level detector includes a modified differential amplifier which compares a first power supply level at a known voltage range with a second power supply level capable of being at multiple power supply levels. The result of the comparison is a signal which indicates the level of the second power supply.

18 Claims, 1 Drawing Sheet

POWER SUPPLY LEVEL DETECTOR

FIELD OF THE INVENTION

The present invention relates to the field of supplying power to integrated circuits; more particularly, the present invention relates to the field of power supply level detection.

BACKGROUND OF THE INVENTION

A large majority of electronic circuits require one or more power supplies for operation. It is a requirement that the power supplies be stable. However, even though the power supplies are considered stable, the power supply levels generated for some applications usually vary during operation. For instance, a 3.3 volt power supply may generate anywhere from 2.8 volts to 3.7 volts during its operation and still be considered a 3.3 volt power supply. Similarly, a 5 volt power supply may generate anywhere from 4.2 to 5.6 volts during its operation and still be considered a 5 volt power supply. These varying type of power supplies are employed in powering electronic circuitry on computer chips.

Today, certain computer chips are capable of operating with two different power supply levels. For instance, a chip may be able to operate using either a 5 volt or a 3.3 volt power supply. Furthermore, certain chips in the market today utilize different power supply levels for different portions of the chip. In other words, a portion of the chip may be powered by a power supply at one level (e.g., 5 volt supply), while another portion of the chip is powered by a power supply at a different level (e.g., 3.3 volt supply). Also a portion of the chip may be powered by a power supply at one level (e.g., 3.3 volt supply), while another portion of the chip is capable of operating at more than one power supply level (e.g., 3.3 volts or 5 volts).

Some of the circuitry on these dual or multi-power supply level chips are sensitive to the power supply level under which they operate. In these instances, the circuits must be programmed according to the power supply level which is being utilized. In the prior art, these circuits are programmed in one of two ways. First, a set of registers located on the chip itself is available for the user to program the level of the power supply currently being used. Depending on how the user programs the register, the circuitry is able to compensate for the various power supplies levels which can be received. However, the use of registers on-chip requires the use of memory storage on-chip. Memory storage is limited on-chip and generally there is a need to limit the use of on-chip memory. Furthermore, the use of these on-chip registers requires the time of a system designer to program them.

Second, external pins may be used to indicate to the chip the level of the power supply being used. For instance, when a single pin is used to indicate the power supply level for a chip, the chip is capable of operating at two different power supply levels. When the pin is in one state (e.g., a logical 0), the power supply level is at a first level, while if the pin is at the other state (e.g., a logical 1), then the power supply is at a second level. If multiple portions of a chip are capable of operating at different power levels, then each separate portion would require a separate pin. The number of pins on a chip directly affects the size of the chip. The more pins a chip has, the larger it is. To minimize the chip size, the number of pins must be reduced. Thus, there is a need to allow a chip, or portion thereof, to be powered by more than one power supply level, while keeping the pin count down.

As will be shown, the power supply level detector of the present invention eliminates the need to have on-chip programmable registers to indicate to the chip the power supply level. Also the power supply level detector of the present invention eliminates the need to use external pins to program circuitry requiring knowledge of the power supply level to operate correctly. The power supply level detector of the present invention determines the level of the power supply and generates a signal indicative of that level.

SUMMARY OF THE INVENTION

A power supply level detector is described. The power supply level detector includes a modified differential amplifier which compares a first power supply level at a known voltage range with a second power supply level capable of being at different power supply levels, each of which is at a separate known voltage range. The result of the comparison is a signal which indicates the level of the second power supply.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiments, but are for explanation and understanding only.

DETAILED DESCRIPTION OF THE INVENTION

A power supply level detector is described. In the following description, numerous specific details are set forth, such as specific voltages, transistor sizes, etc., in order to provide a thorough understanding of the preferred embodiment of the present invention. It will be obvious to those skilled in the art that the present invention may be practiced without these specific details. Also, well-known circuits have been shown in block diagram form, rather than in detail, in order to avoid unnecessarily obscuring the present invention.

Figure 1:
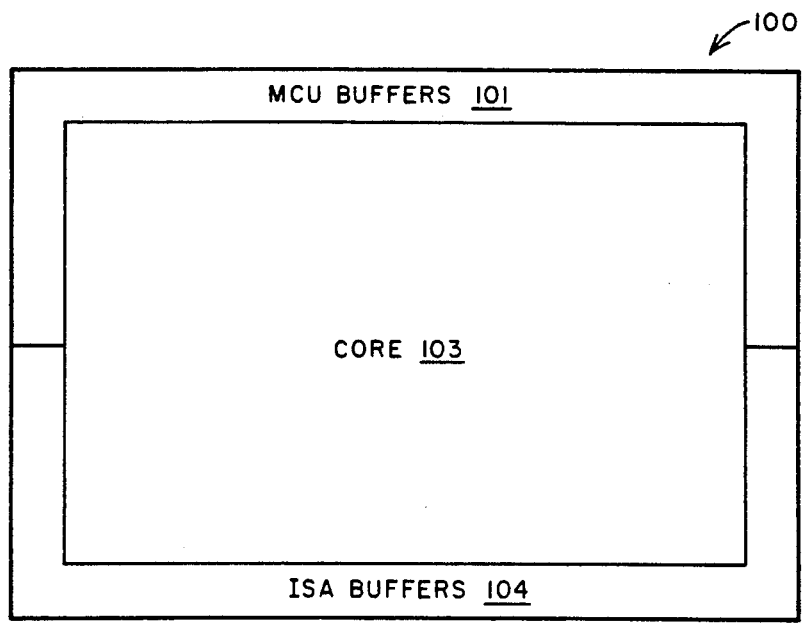
FIG. 1 is a block diagram of the microprocessor of the present invention.

FIG. 1 shows a block diagram of microprocessor 100, utilized by the preferred embodiment of the present invention. Processor 100 is utilized in conjunction with a computer system which generally includes a bus, a main memory, a static memory, a display device, an alphanumeric input device, and a hardcopy device (all of which are not shown in order to avoid confusion). Of course, certain computer system implementations and uses of the present invention may not require nor include all of these components.

Processor 100 is preferably manufactured as an integrated circuit using a metal-oxide semiconductor (MOS) process. Referring to FIG. 1, processor 100 generally comprises core unit 103. Core unit 103 includes logic and circuitry for processing data, an external bus control unit for controlling communication of processor 100 with the bus of the computer system, and a memory control unit (MCU) for controlling communication of processor 100 with the main memory of the computer system. Processor 100 includes MCU buffers 101 for buffering data between the core unit 103 and the memory of the computer system. Processor 100 also includes ISA buffers 104 for buffering communication between core unit 103 and the bus of the computer system. Core 103, MCU buffers 101 and ISA buffers 104 are coupled together using system bus and control signal path (not shown).

In the present invention, core unit 103, MCU buffers 101 and ISA buffers 104 are all powered by individual power supply levels. In the currently preferred embodiment, core unit 103 is capable of operating at only one power supply level. In the currently preferred embodiment, core unit 103 is powered by a 3.3 volt power supply. In the present invention, MCU buffers 101 and ISA buffers 104 are capable of operating at multiple power levels. In the currently preferred embodiment, MCU buffers 101 and ISA buffers 104 are capable of operating with power supply levels of either 3.3 or 5 volts. Thus, it is possible that a portion of processor 100 is being powered at 3.3 volts (e.g., core unit 103), while another portion (e.g., MCU buffers 101 and/or ISA buffers 104) is operating at 5 volts.

It should be noted that although the power supply levels are 3.3 volt and 5 volt power supplies, the power supply levels actually vary from their rated 3.3 and 5 volts values, even though the power supplies are considered 3.3 and 5 volts respectively. For instance, in the case of 3.3 volts, the power supply level is capable of ranging from 2.8 to 3.7 volts, yet still is considered a 3.3 volt power supply. Similarly, in the case of 5 volts, the power supply level is capable of ranging from 4.2 to 5.6 volts, yet still is considered a 5 volt power supply.

Some of the circuitry in both MCU buffers 101 and ISA buffers 104 must know the level of the power supply which is currently being used to power their operation, e.g., whether it be 3.3 or 5 volts. Separate circuitry in both MCU buffers 101 and ISA buffers 104 determines the power supply level. The present invention determines the level of the power supply by comparing the power supply level to a known power supply level (i.e., a predetermined power supply level). In the currently preferred embodiment, the predetermined power supply level is that of core unit 103 which only operates at one level, such that each of the power supply levels is compared against the power supply level of core unit 103. The result of the comparison is a signal which indicates the power supply level that is being used. It should be noted that the following discussion only focuses on the determination of the power supply level for MCU buffers 101. However, the present invention could also be used to identify the power supply level for ISA buffers 104 or any other circuitry that must know the level of the power supply that is powering their operation.

Figure 2:
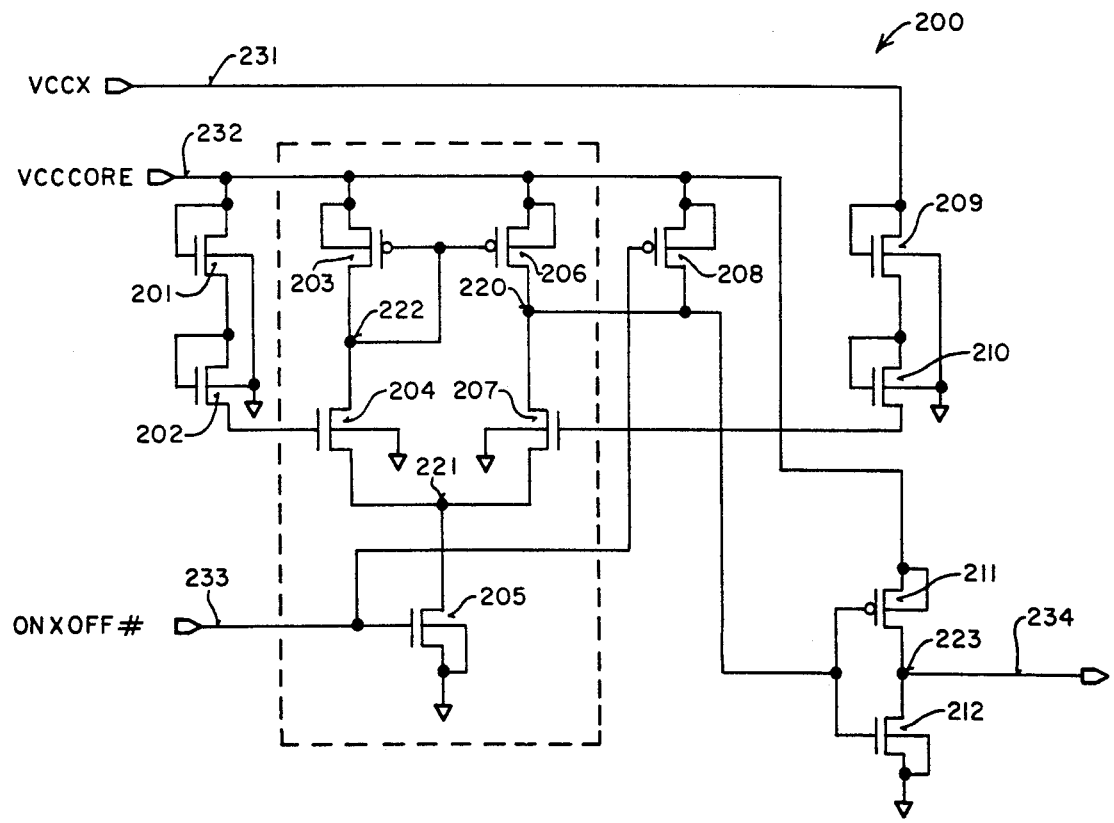
FIG. 2 illustrates a circuit schematic of the power supply level detector of the present invention.

The currently preferred embodiment of the power supply level detector circuitry 200 of the present invention is shown in FIG. 2. Power supply level detector 200 comprises a complementary MOS (CMOS) circuit. Level detector 200 receives the power supply voltage of the core unit, VCCCORE, via line 232 and the power supply voltage, VCCX, of the MCU buffers via line 231 and generates a signal on line 234 indicating the power supply level of the MCU buffers. In the currently preferred embodiment, the output signal 234 indicates whether the power supply voltage level of MCU buffers is 3.3 or 5 volts. Power supply level detector 200 also receives an on/off signal on line 233 which is capable of turning off power level detector 200. In the currently preferred embodiment, power level detector 200 does not operate unless the on/off signal is in the "on" position, indicated by a logical 1 (high) on line 233.

Referring to FIG. 2, level detector 200 comprises n-channel (NMOS) devices 201, 202, 204, 205, 207, 209, 210 and 212 and p-channel (PMOS) devices 203, 206, 208 and 211. In the currently preferred embodiment, all of the devices are transistors. The drain and gate of device 201 are coupled to the core unit power supply (line 232). The source of device 201 is coupled to the source and gate of device 202. The drain of device 202 is coupled to the gate of device 204. The source of device 204 is coupled to node 222. The drain of device 204 is coupled to node 221. The source and gate of device 209 are coupled to the MCU Buffers power supply (line 231). The drain of device 209 is coupled to the source and gate of device 210. The drain of device 210 is coupled to the gate of device 207. The source of device 207 is coupled to node 220. The drain of device 207 is coupled to node 221. The sources of devices 203 and 206 are coupled to the core unit power supply (line 232). The gates of devices 203 and 206 are coupled together and are coupled to node 222. The drains of devices 203 and 206 are coupled to nodes 222 and 220, respectively. Node 221 is coupled to the drain of device 205. The source of device 205 is coupled to ground, and the gate of device 205 is coupled to the on/off signal (line 233). Thus, devices 204, 205 and 207 are coupled as a differential amplifier. Devices 203 and 206 are coupled as a current mirror and act as loads for devices 204 and 207, respectively. Thus, devices 203-207 are coupled as a differential amplifier with an active current mirror load. The output of the differential amplifier configuration formed by devices 203-207 is taken at node 220.

The output at node 220 is coupled to the drain of device 208. The source of device 208 is coupled to the core unit power supply (line 232). The gate of device 208 is coupled to the on/off signal (line 233). Node 220 is also coupled to the gates of devices 211 and 212. The source of device 211 is coupled to the core unit power supply (line 232). The drain of device 211 is coupled to node 233. The source of device 212 is coupled to ground. The drain of device 212 is coupled to node 223. Thus, devices 211 and 212 are coupled as an inverter with the signal at node 220 being the input and node 223 being the output. The output of the inverter (line 234) is the output of power supply level detector 200.

The inputs to the differential amplifier formed by devices 203-207 are the gates of devices 204 and 207. The input on the gate of device 204 is the voltage level of the core unit power supply (line 232) less the voltage drop created by devices 201 and 202. In the currently preferred embodiment, the voltage drop of devices 201 and 202 together equals approximately 1.5 volts. Therefore, in the currently preferred embodiment, since the power supply of the core unit varies between 2.8 and 3.7 volts, the voltage that appears on the gate of device 204 ranges between 1.3 and 2.2 volts. Similarly, the input on the gate of device 207 is the voltage level of the power supply of the MCU buffers (line 231) less the voltage drop created by devices 209 and 210. In the currently preferred embodiment, the voltage drop of devices 209 and 210 together equals approximately 1.5 volts. Therefore, in the currently preferred embodiment, since the power supply of the MCU buffers varies between 2.8 and 3.7 volts for a power supply level of 3.3 volts and between 4.2 and 5.6 volts for a power supply level of 5 volts, the voltage that appears on the gate of device 207 ranges between 1.3 and 2.2 volts for a power supply level of 3.3 volts and between 2.7 and 4.1 for a power supply level of 5 volts. In the currently preferred embodiment, devices 201, 202, 209 and 210 have a channel width of 5μ and a channel length of 1.5μ.

The sizes of devices 204 and 207 of the differential amplifier allow power supply level detector 200 to compare the power supply level of the core unit with the power supply level of the MCU buffers. Device 205 acts as a constant current source. Device 204 is stronger than device 207. Devices 204 and 207 are sized, such that if VCCCORE and VCCX are equal, most of the current of the constant current source flows through device 204 and a very small current flows through device 207 and 206, thereby forcing node 220 to a high voltage. Note that in the currently preferred embodiment when VCCCORE and VCCX are 3.3 volt power supplies, they both are powered by the same source, such that their voltage level will be equal in the range of 2.8-3.7 volts. When VCCX is a 5 volt power supply and ranges from 5.6 to 4.2 volts and VCCCORE is a 3.3 volt power supply ranging from 3.3 to 2.8 volts, most of the current of the constant current source flows through device 207 and 206, thereby forcing node 220 to a low voltage. In the currently preferred embodiment, device 204 has a channel width of 5μ and a channel length of 20μ, and device 207 have a channel width of 5μ and a channel length of 30μ. Thus, in the currently preferred embodiment, device 207 is weaker than device 204.

If the voltage on the gate of device 207 is larger than that on the gate of device 204, more current flows through device 207 than device 204 to node 221. The increased current flow through device 207 causes a drop in the voltage at node 220. In the case where the power supply for the MCU buffers is a 5 volt supply, in the currently preferred embodiment, the voltage on node 220 drops to approximately 0.5 volts. If the voltages on the gates of devices 204 and 207 are the same, then device 204 contributes more to the current at node 221, such that the voltage at node 220 does not drop much. In the case where the power supply for the MCU buffers is a 3.3 volt supply, in the currently preferred embodiment, the voltage on node 220 drops to only approximately 2.6 volts.

The inverter created by devices 211 and 212 produces the output of power supply level detector 200. Devices 211 and 212 are sized, such that the output signal generated at node 223 on line 234 is either at a logical 0 (e.g., 0 volts) or at logical 1 (e.g., 3.3 volts). In the currently preferred embodiment, since the voltage on the gates of devices 211 and 212 from node 220 ranges between approximately 0.5 and 2.6 volts, devices 211 and 212 must be sized, such that the output signal produced is 3.3 volts for a 5 volt power supply level or 0 for a 3 volt power supply level. In the currently preferred embodiment, devices 211 and 212 are equal in size, each have a channel width of 10μ and a channel length of 1.2μ.

If power supply level detector 200 is left "on" during the operation of the chip, it continues consuming power after the power supply level of the MCU buffers has been determined. The on/off signal (line 233), in conjunction with devices 208 and 205, operates to turn power supply level detector 200 off. After the level of the MCU buffers power supply has been determined, the on/off signal (line 233) goes low. The on/off signal being low causes device 205 to turn off and device 208 to turn on. When device 208 turns on, node 220 is brought up to the voltage level of the core unit. In this manner, power supply level detector 200 is turned off, and the output of power supply level detector 200 is brought to a logical 0. Therefore, power supply level detector 200 does not consume power. Thus, the present invention provides a means for turning off power supply level detector 200 once the determination of the power supply level is made.

By using circuitry on-chip to determine the power supply level being used, a configuration register is not required. Furthermore, the efforts of a system designer are not required to program that on-chip configuration register to configure the level dependent circuitry of the chip. Thus, the present invention saves the use of a configuration register. Moreover, the on-chip circuitry saves pins which might have been needed to indicate the power supply level.

Whereas many alterations and applications of the present invention will no doubt become apparent to a person of ordinary skill in the art after having read the foregoing description, it is understood that the particular embodiment shown and described by illustration is in no way intended to be limiting. Therefore, reference to details of the preferred embodiments are not intended to limit the scope of the claims which themselves recite only those features regarded as essential to the invention.

Thus, a power supply level detector has been described.

I claim:

1. A power supply level detector comprising:
   a first node;
   a first bias means coupled to said first node for biasing said first node in response to a first power supply, wherein the first power supply is rated at a first value to supply a predetermined power supply level that varies over a first voltage range;
   a second bias means coupled to said first node for biasing said first node in response to an input power supply level, wherein said input power supply level is capable of being at a plurality of rated power supply levels including said predetermined power supply level, such that the input power supply level varies over a second voltage range;
   wherein said first bias means and said second bias means comprise a plurality of transistor devices of different sizes and said first bias means and second bias means bias said first node, such that a potential is generated at said first node, said potential being indicative of said input power supply level, wherein if the predetermined power supply level and the input power supply level are both in said first voltage range then the first node is at a first potential and if the input power supply level is not in said first voltage range then the first node is at a second potential.

2. A power supply level detector comprising:
   a first node;
   a first bias means coupled to said first node for biasing said first node in response to a predetermined power supply level;
   a second bias means coupled to said first node for biasing said first node in response to an input power supply level, wherein said input power supply level is capable of being at a plurality of levels including said predetermined power supply level;
   wherein said first bias means and second bias means bias said first node, such that a potential is generated at said first node, said potential being indicative of said input power supply level, and wherein each said first and second bias means comprise transistor devices of different sizes, such that if the predetermined power supply level is the same as the input power supply level then the first node is at a first potential and if the predetermined power supply level is not the same as the input power supply level then the first node is at a second potential.

3. A power supply level detector comprising:
comparing means for comparing an input power supply level and a predetermined power supply level, wherein the predetermined power supply is rated to supply a voltage that varies over a first voltage range, and wherein said input power supply level is capable of being at one of a plurality of rated power supply levels including said predetermined power supply level, such that the input power supply level varies over a second voltage range, said comparing means comparing said input power supply level and said predetermined power supply level using a plurality of transistor devices of different sizes and generating a first signal indicative of said input power supply level; and
output means responsive to said first signal for generating a second signal indicative of said input power supply level, wherein the first signal is at a first potential if said input power supply level and the predetermined power supply level are in the first voltage range, and the first signal is at a second potential if said power supply level and the predetermined power supply level are not in the first voltage range.

4. The detector as defined in claim 3 wherein said comparing means compares voltages.

5. A power supply level detector comprising:
comparing means for comparing an input power supply level and a predetermined power supply level, wherein said input power supply level is capable of being at one of a plurality of power supply levels including said predetermined power supply level, said comparing means comparing said input power supply level and said predetermined power supply level and generating a first signal indicative of said input power supply level; and
output means responsive to said first signal for generating a second signal indicative of said input power supply level, wherein the first signal is at a first potential if said input power supply level is the same as the level of the predetermined power supply level, and the first signal is at a second potential if said power supply level is not the same as the predetermined power supply level, wherein said comparing means includes a differential amplifier comprised of transistor devices of different sizes, such that if the predetermined power supply level is the same as the input power supply level than the second signal is at a potential and if the predetermined power supply level is not the same as the input power supply level than the second signal is at a second potential.

6. A power supply voltage level detector comprising:
a differential amplifier having a first node, wherein the differential amplifier compares an input power supply voltage level and a predetermined power supply voltage level, wherein said input power supply voltage level is capable of being at one of a plurality of power supply voltage levels, said differential amplifier having a plurality of transistor devices of different sizes, such that if the predetermined power supply voltage level is the same as the input power supply level then the first node is placed at a first potential and if the predetermined power supply voltage level is not the same as the input power supply voltage level than the first node is placed at a second potential; and
output means coupled to and responsive to said first node of said differential amplifier for generating a first signal indicative of said input power supply voltage level, wherein the first signal is at a third potential if said first node is at said first potential and the first signal is at a fourth potential if said first node is at said second potential.

7. The detector as defined in claim 6 further comprising means for disabling said differential amplifier after generating said first signal.

8. The detector as defined in claim 7 wherein said means for disabling comprises at least one transistor.

9. The detector as defined in claim 6 wherein said plurality of transistor devices are field-effect transistors (FETs).

10. The detector as defined in claim 6 wherein said differential amplifier includes a load.

11. The detector as defined in claim 10 wherein said load comprises a current mirror.

12. A power supply level detector for an integrated circuit having a plurality of sections, wherein at least one of the sections operates at a first power supply level and a second of said sections operates at a second power supply level, wherein said second power supply level is capable of being one of a plurality of power supply levels including said first power supply level, said detector comprising:
a differential amplifier means for comparing the first power supply level of said at least one section with the second power supply level of said second of said sections, wherein said differential amplifier means includes a plurality of transistor devices of different sizes, such that if the first power supply level is the same as the second power supply level then a first signal is at a first potential and if the first power supply level is not the same as the second power supply level than the first signal is at a second potential;
output means responsive to said first signal for outputting a second signal to said second of said sections section to indicate its power supply level.

13. An integrated circuit comprising:
a plurality of sections, wherein at least one of the sections operates at a predetermined power supply level and a second of said sections operates at an input power supply level, wherein said input power supply level is capable of being one of a plurality of power supply levels including said predetermined power supply level;
a power supply level detector coupled to receive the predetermined power supply level and the input power supply level, said power supply level detector having
a first node;
a first bias means coupled to said first node for biasing said first node in response to a predetermined power supply level;
a second bias means coupled to said first node for biasing said first node in response to an input power supply level, wherein said input power supply level is capable of being at a plurality of levels including said predetermined power supply level; wherein said first bias means and second bias means bias said first node, such that a potential is generated at said first node, said potential being indicative of said input power supply level, and wherein each said first and second bias means comprise transistor devices of different sizes, such that if the predetermined power supply level is the same as the input power supply level then the first node is at a first potential and if the predetermined power supply level is not the same as the input power supply level then the first node is at a second potential.

14. An integrated circuit comprising:
a plurality of sections, wherein at least one of the sections operates at a predetermined power supply level and a second of said sections operates at an input power supply level, wherein said input power supply level is capable of being one of a plurality of power supply levels including said predetermined power supply level; and
a power supply level detector coupled to receive the predetermined power supply level and the input power supply level, said power supply level detector having
a differential amplifier having a first node, wherein the differential amplifier compares an input power supply voltage level and a predetermined power supply voltage level, wherein said input power supply voltage level is capable of being at one of a plurality of power supply voltage levels, said differential amplifier having a plurality of transistor devices of different sizes, such that if the predetermined power supply voltage level is the same as the input power supply level then the first node is placed at a first potential and if the predetermined power supply voltage level is not the same as the input power supply voltage level than the first node is placed at a second potential; and
output means coupled to and responsive to said first node of said differential amplifier for generating a first signal indicative of said input power supply voltage level, wherein the first signal is at a third potential if said first node is at said first potential and the first signal is at a fourth potential if said first node is at said second potential.

15. The integrated circuit defined in claim 14 wherein said plurality of transistor devices comprise field-effect transistors (FETs).

16. The integrated circuit defined in claim 14 wherein said differential amplifier includes a load.

17. The integrated circuit defined in claim 16 wherein the load comprises a current mirror.

18. An integrated circuit comprising:
a plurality of sections, wherein at least one of the sections operates at a predetermined power supply level and a second of said sections operates at an input power supply level, wherein said input power supply level is capable of being one of a plurality of power supply levels including said predetermined power supply level; and
a power supply level detector coupled to receive the predetermined power supply level and the input power supply level, said power supply level detector having
a first node;
a first bias means coupled to said first node for biasing said first node in response to a first power supply, wherein the first power supply is rated at a first value to supply a predetermined power supply level that varies over a first voltage range;
a second bias means coupled to said first node for biasing said first node in response to an input power supply level, wherein said input power supply level is capable of being at a plurality of rated power supply levels including said predetermined power supply level, such that the input power supply level varies over a second voltage range; and wherein each said first bias means and second bias means comprise a plurality of transistor devices of different sizes and together bias said first node, such that a potential is generated at said first node, said potential being indicative of said input power supply level, wherein if the predetermined power supply level and the input power supply level are both in said first voltage range then the first node is at a first potential and if the input power supply level is not in said first voltage range then the first node is at a second potential.

* * * * *